United States Patent [19]

Shin et al.

[11] Patent Number: 4,901,005
[45] Date of Patent: Feb. 13, 1990

[54] ZERO VOLTAGE CROSSOVER DETECTOR FOR POLYPHASE SYSTEMS

[75] Inventors: Charles H. Shin, Springfield; George K. Woodworth, Manassas, both of Va.

[73] Assignee: International Business Machines Corporation, Armonk, N.Y.

[21] Appl. No.: 280,470

[22] Filed: Dec. 5, 1988

[51] Int. Cl.$^4$ ............................................ G01R 25/00
[52] U.S. Cl. .................................... 324/86; 324/107
[58] Field of Search ................ 324/83 R, 83 A, 83 D, 324/107, 86; 361/84–86, 87, 42, 47, 48, 44; 328/133, 155

[56] References Cited

U.S. PATENT DOCUMENTS 4,313,146 1/1982 Lee ........................................ 324/107

Primary Examiner—Michael J. Tokar
Attorney, Agent, or Firm—John E. Hoel

[57] ABSTRACT

The invention finds application primarily in three phase power systems having A, B and C voltage phases. The invention includes a first voltage measurement device coupled between the A phase input and the B phase input, having a first measured voltage output. The invention further includes a second voltage measurement device coupled between the A phase input and the C phase input, having a second measured voltage output. The invention also includes a comparator having a first input connected to the first output of the first voltage measurement device and a second input connected to the second output of the second voltage measurement device, for generating a signal when the first measured voltage is equal to and opposite in polarity from the second measured voltage. This signal indicates that a zero crossover event has occurred with the A phase.

4 Claims, 7 Drawing Sheets

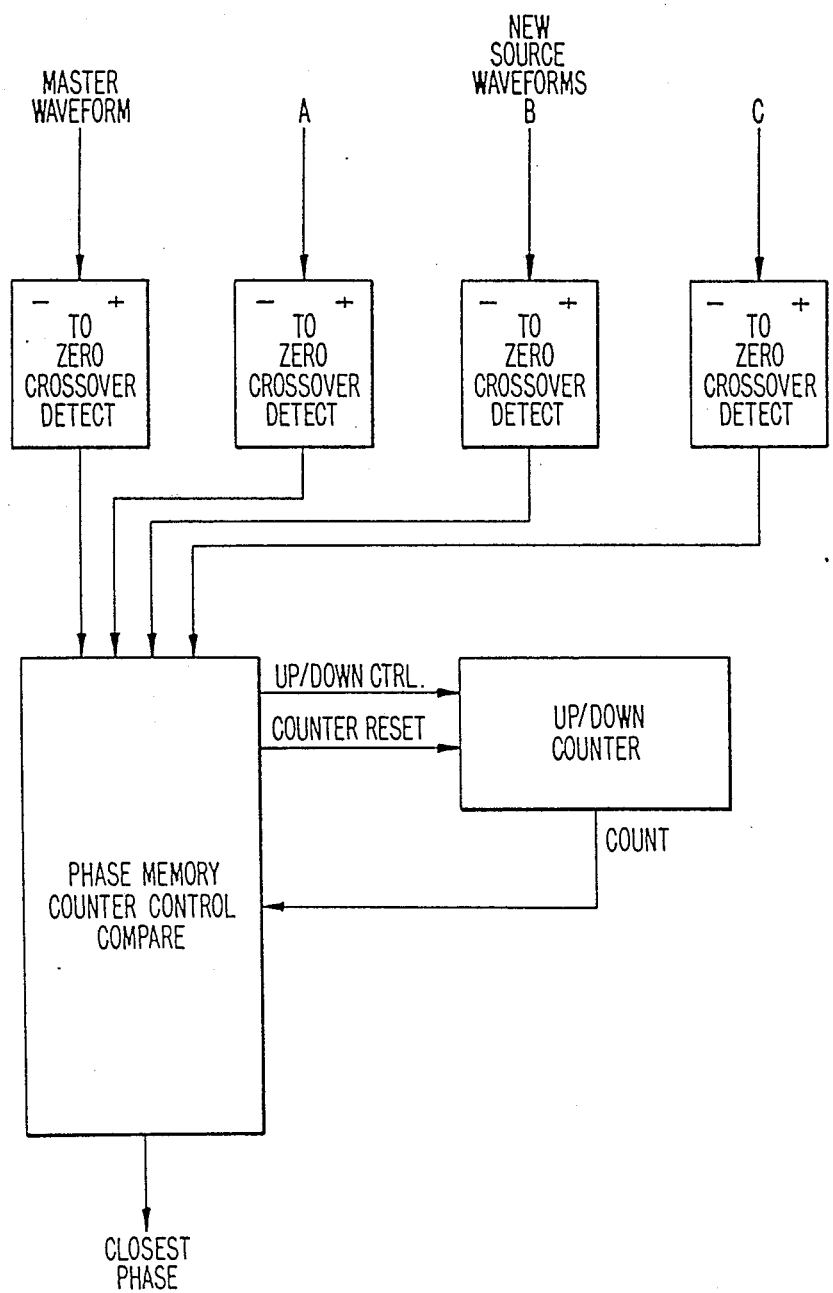

4,901,005

ZERO VOLTAGE CROSSOVER DETECTOR FOR POLYPHASE SYSTEMS

BACKGROUND OF THE INVENTION

1. Technical Field

The invention disclosed broadly relates to the switching of multiphase electrical power sources and more particularly relates to the precise identification of zero crossover for the relative phases in a polyphase system.

2. Background Art

Delta power systems and some unreferenced wye power systems are commonly used in power generation and distribution networks. These are three phase voltage systems, the waveform of which is shown in FIG. 1. Conventionally, three phase voltage waveforms are represented by phase A, phase B and phase C which are generated so as to be 120 degrees in phase separation, respectively. The measurement of the relative timing is generated at the respective phases crossing zero volts is important in power switching control applications. For example, reference is made to the U.S. Pat. No. 4,761,563 to Ross and Woodworth, entitled "Asynchronous Multiphase Switching Gear," wherein FIG. 28 shows a waveform coincidence detector circuit which requires the detection of the zero crossover for each respective phase A, B and C, in order to carry out the operation of synchronously transferring three phase power from a first power source to a second power source. This is just one example of many which could be provided of the need to identify when the phases cross zero volts. Proper phasing and control of electronic switching devices often rely on this timing information. The actual passage of a phase through zero cannot be recorded accurately at times due to power line noise. The displacement of the imaginary neutral voltage reference point from ground due to unbalanced ground currents and system switching delays cause significant errors. This can be better understood with reference to the vectorial representation of a three phase power system, as is shown in FIG. 2. FIG. 2 illustrates a vectorial representation of the three phases A, B and C as an equilateral triangle. It is seen in the six views of the vectorial triangle in FIG. 2, that the triangle appears to be rotating in a clockwise direction. This represents each of a 60 degree increment in the rotation of the three phase generator supplying the power to the three phase system. The geometry of the three phase waveforms as shown in FIG. 2, can be described as follows. In a three phase alternating current (AC) system, one phase, for example phase A, will cross through an imaginary zero voltage point when the other two phase voltages, for example B and C phases, are equal and opposite in magnitude. This can be seen in the diagram of FIG. 2 which shows the vectorial representation of a three phase power system and occurs twice per phase in a full revolution of the three phase generator. The crossings occur at both the negative to positive and at the positive to negative polarity crossings. FIG. 2 has six views labeled 1 through 6. In view 1, a positive going crossing is illustrated for the A phase. In view 2, a negative going crossing is illustrated for the B phase. In view 3, a positive going crossing is illustrated for the C phase. In view 4, a negative going crossing is illustrated for the A phase. In view 5, a positive going crossing is illustrated for the B phase. In view 6, a negative going crossing is illustrated for the C phase. The prior art has not provided a reliable, noise tolerant technique for identifying the zero crossing of the respective phases of a polyphase power system.

OBJECTS OF THE INVENTION

It is therefore an object of the invention to provide an improved means to identify the zero phase crossing of the phases in a polyphase power system.

It is another object of the invention to provide an improved, noise tolerant measurement means for identifying the zero crossings of the phases in a polyphase power system.

SUMMARY OF THE INVENTION

These and other objects, features and advantages of the invention are accomplished by the zero voltage crossover detector for polyphase systems, disclosed herein. The invention finds application primarily in three phase power systems having A, B and C voltage phases. The invention includes a first voltage measurement device coupled between the A phase input and the B phase input, having a first measured voltage output. The invention further includes a second voltage measurement device coupled between the A phase input and the C phase input, having a second measured voltage output. The invention also includes a comparator having a first input connected to the first output of the first voltage measurement device and a second input connected to the second output of the second voltage measurement device, for generating a signal when the first measured voltage is equal to and opposite in polarity from the second measured voltage. This signal indicates that a zero crossover event has occurred with the A phase.

BRIEF DESCRIPTION OF THE DRAWINGS

These and other objects, features and advantages of the invention will be more fully appreciated with reference to the accompanying figures.

FIG. 8 is the waveform coincidence detector circuit shown as FIG. 28 in the above referenced Ross and Woodworth patent.

DESCRIPTION OF THE BEST MODE FOR CARRYING OUT THE INVENTION

Figure 1:
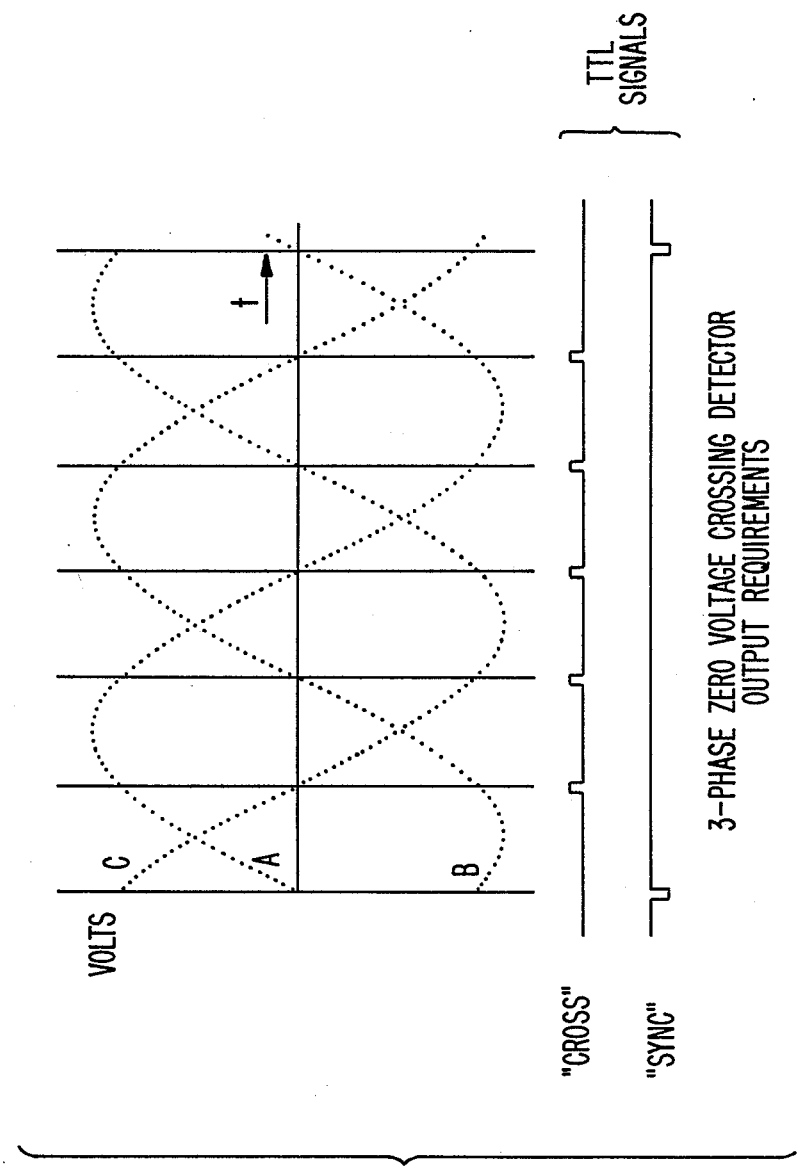
FIG. 1 is a waveform diagram of a three phase power system, illustrating the voltage phases A, B and C.
Figure 2:
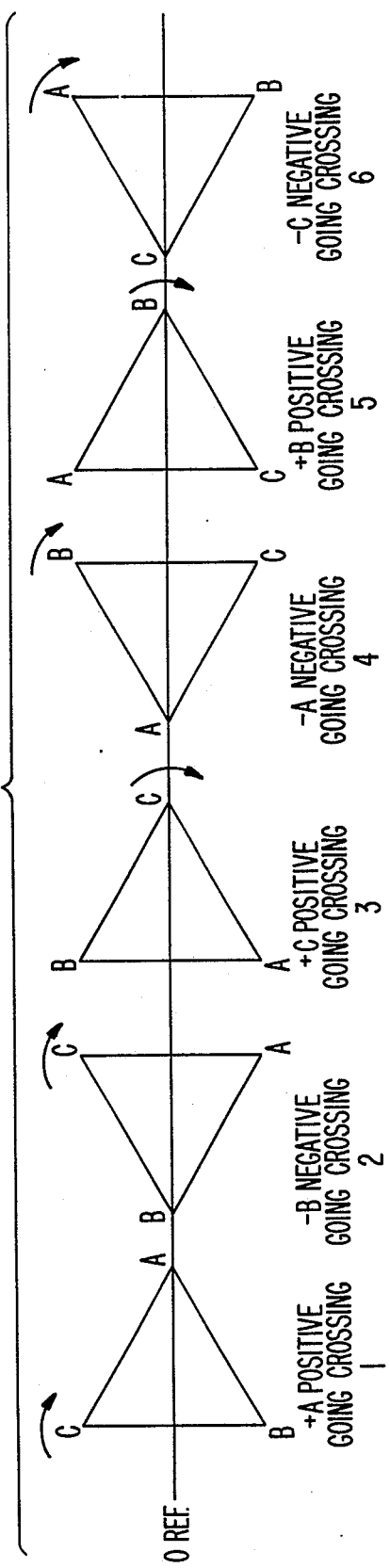
FIG. 2 is a vectorial representation of the three phase voltage waveforms shown in FIG. 1.
Figure 3:
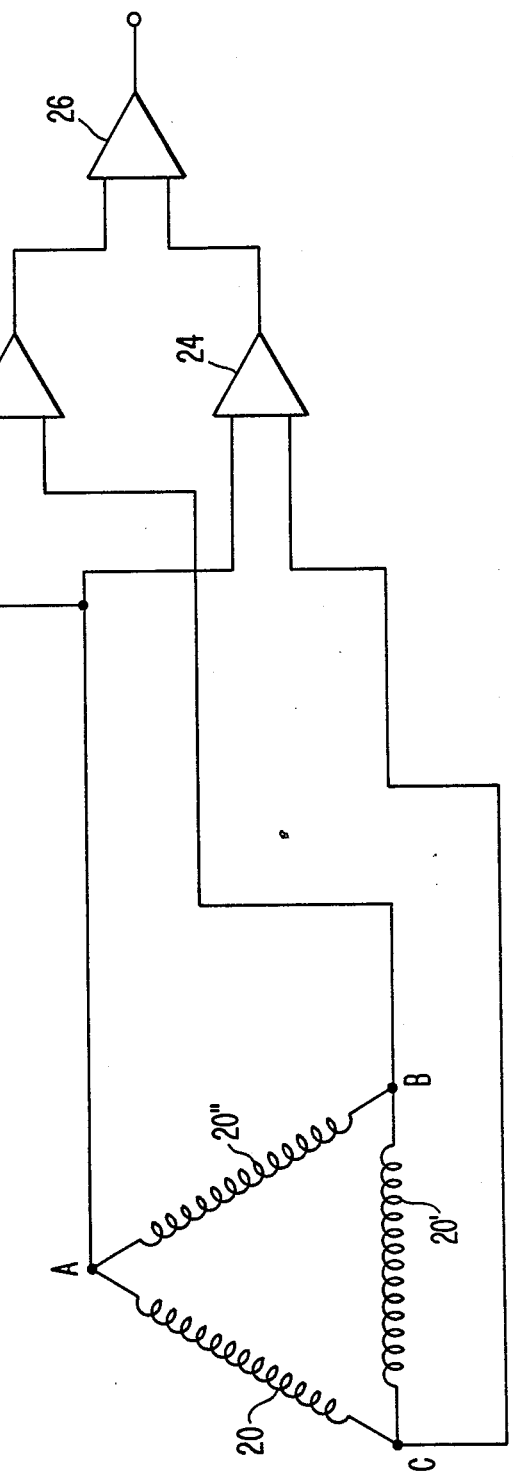
FIG. 3 is a circuit schematic diagram of the zero voltage crossover detector for a three phase system.

FIG. 3 illustrates a circuit schematic diagram of the zero voltage crossover detector for a three phase system. Illustrated in the figure is a three phase alternator which includes the coils 20, 20' and 20". Coil 20 is connected between the A and C phases. Coil 20' is connected between the C and B phases. Coil 20" is connected between the A and B phases. A first voltage measurement device 22 has its inputs connected between the phase A and the phase B and serves to measure the voltage or potential difference between the phases A and B and it outputs that measured voltage output as a first value. A second voltage measuring device 24 is shown in FIG. 3 connected between the phase A and the phase C and it serves to measure the potential difference between A and C and provides that measured voltage output as a second measured value. A comparator 26 has a first input connected to the output of the first voltage measuring device 22 and a second input connected to the output of the second voltage measuring device 24, for generating a signal when the first measured voltage value from measuring device 22 is equal in magnitude and opposite in polarity from the second measured voltage value from the output of the measuring device 24. The presence of this signal indicates the zero crossover event has occurred for the A phase.

Similar configurations for two voltage measuring devices and a comparator are used to identify the zero crossover event for the B phase and the zero crossover event for the C phase.

Figure 4:
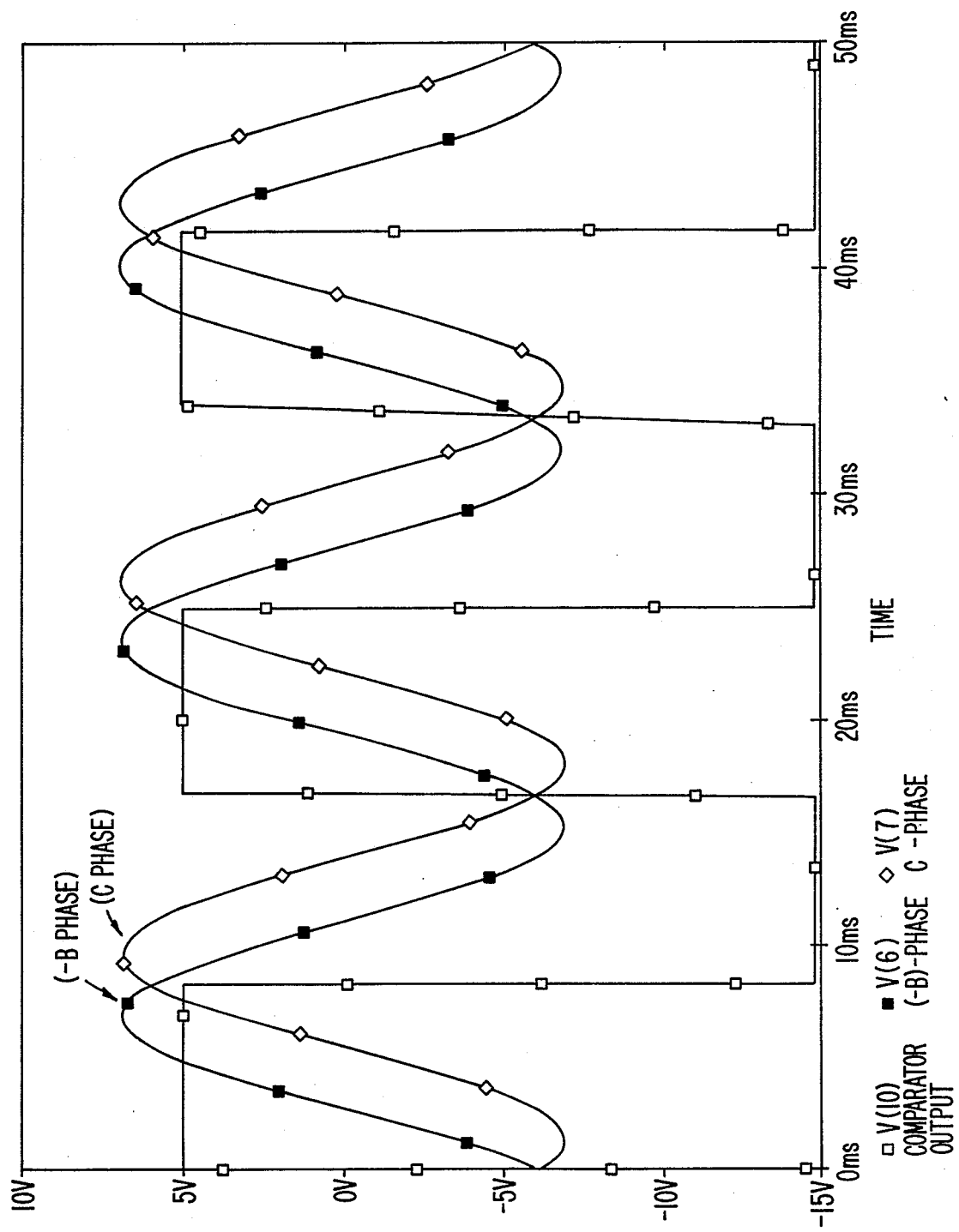
FIG. 4 is a voltage waveform diagram of the operation of the circuit shown in FIG. 3.

FIG. 4 is a waveform diagram illustrating the operation of the invention shown in FIG. 3. Shown in FIG. 4 is a graph with voltage as the ordinate and time as the abscissa, illustrating the voltage waveform for the C phase and the inverse (−B) waveform for the B phase. It is seen that when the C phase voltage is equal in magnitude and opposite in polarity to the B phase voltage, that a transition is shown in the solid line shown in the graph of FIG. 4, which is the signal representing the zero crossover event for the A phase. It is seen that the zero crossover event for the A phase occurs twice per each revolution of the alternator in FIG. 3.

Figure 5:
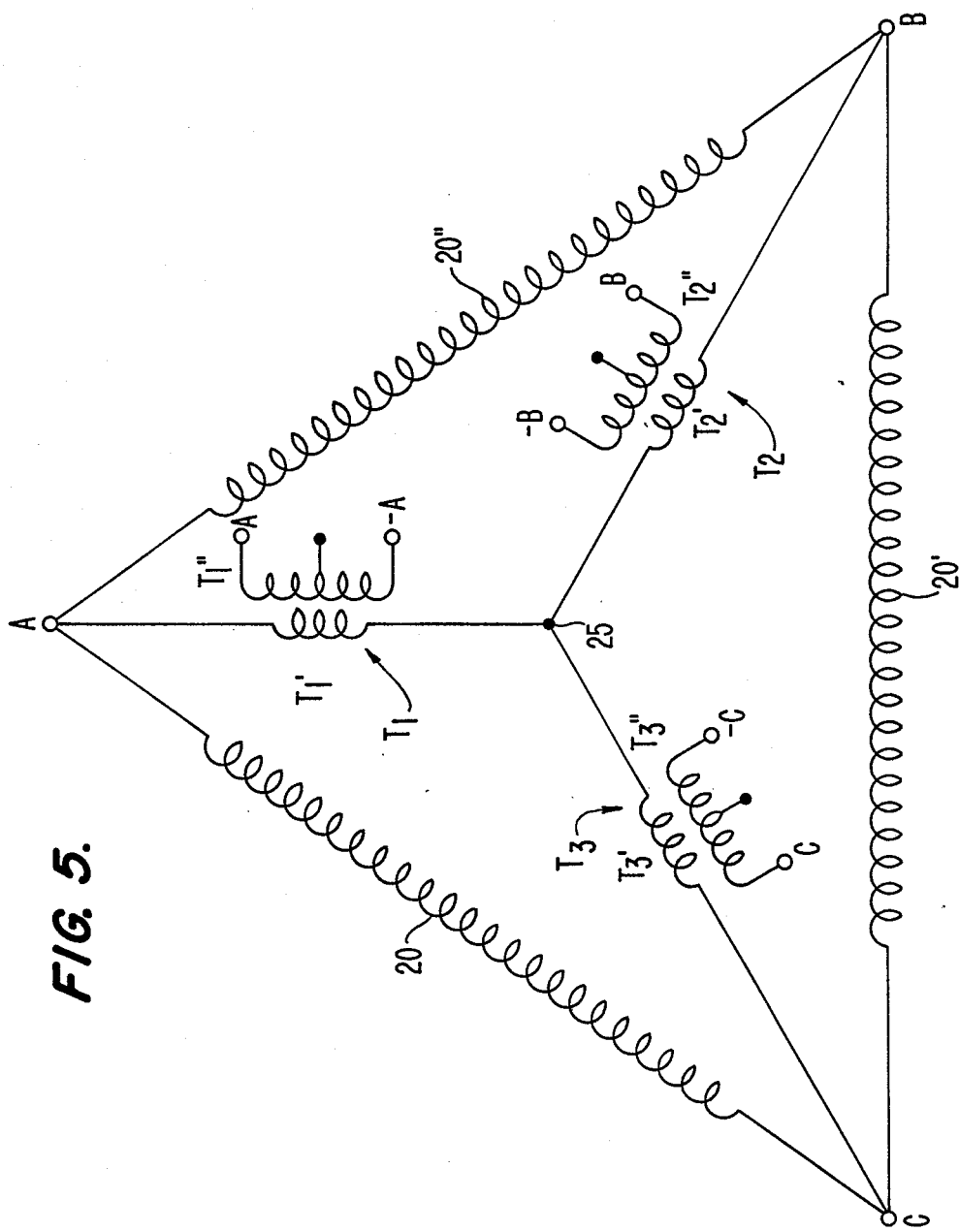
FIG. 5 is a circuit schematic diagram which illustrates how the invention shown in FIG. 3 can be embodied as three transformers whose primary coils are connected to each respective phase A, B and C and are connected in common to one another, the transformers having secondary coils which are center tapped.
Figure 6:
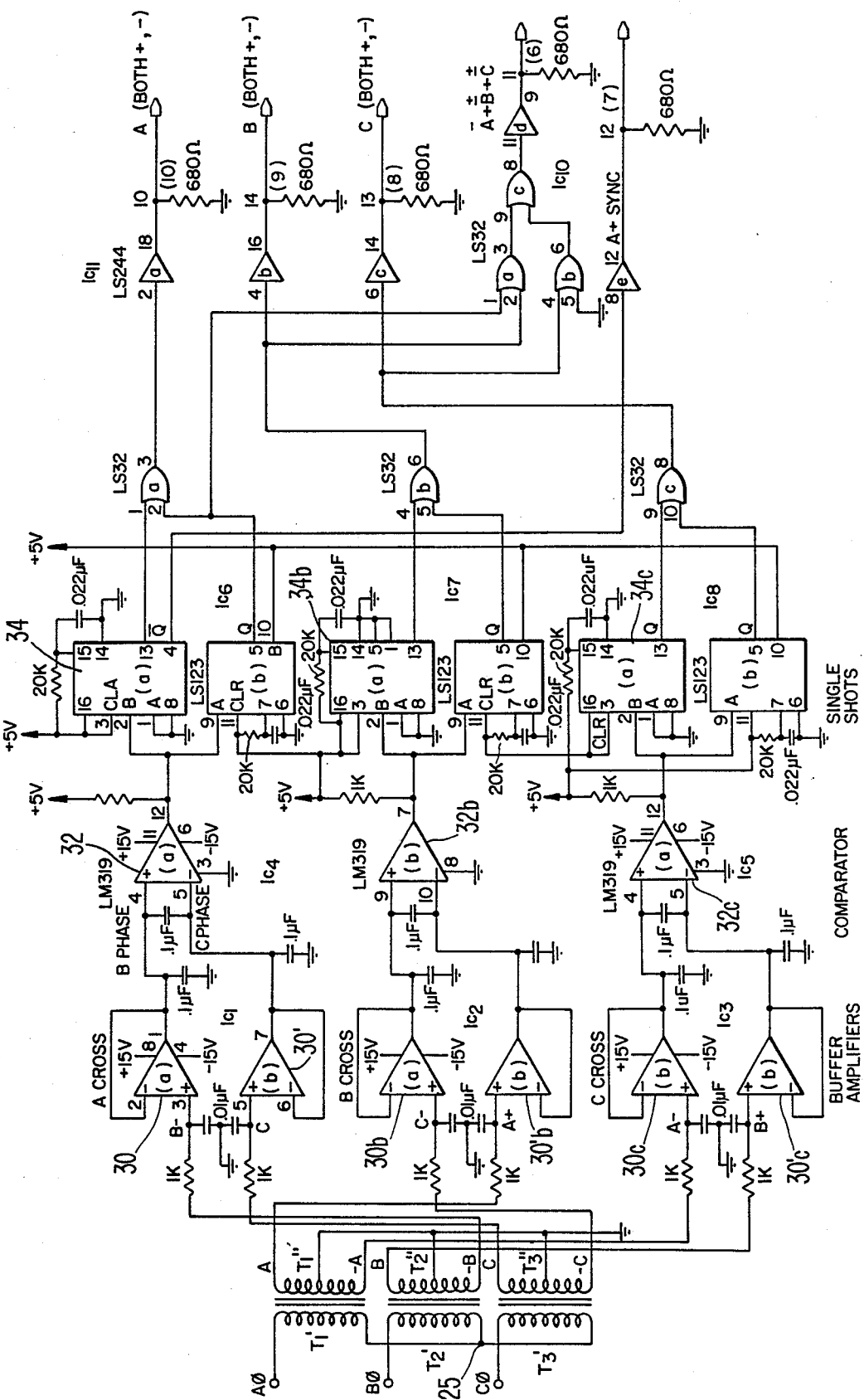
FIG. 6 is a detailed circuit schematic diagram of the invention showing the three transformer embodiment of FIG. 5 as the input for the phases A, B and C circuit.
Figure 7:
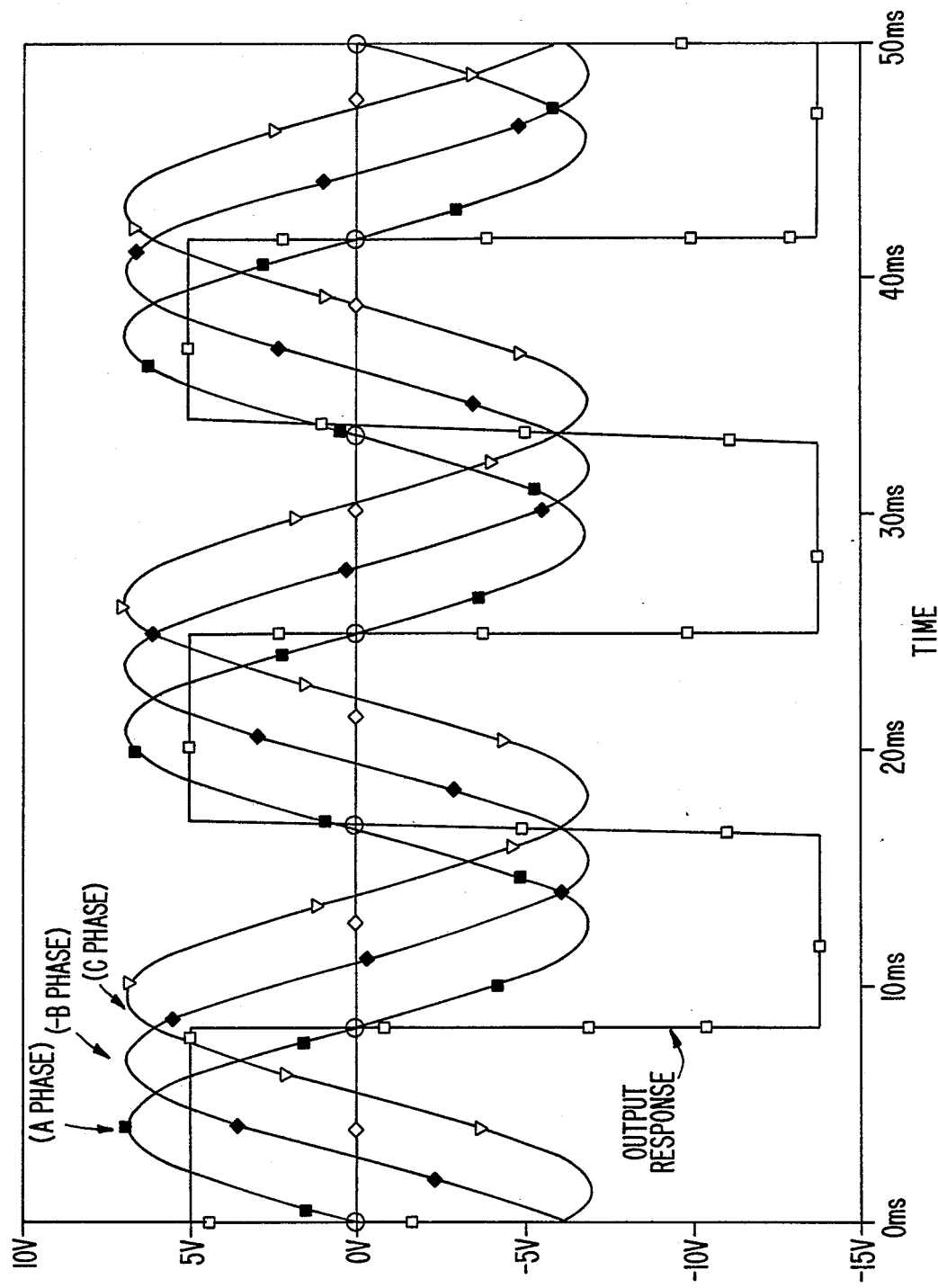
FIG. 7 is a waveform diagram illustrating the operation of the circuit shown in FIG. 6.

FIG. 5 is a circuit schematic diagram illustrating how three transformers T1, T2 and T3 can serve as three voltage measuring devices for measuring the zero crossover event for the three phases A, B and C. Shown in FIG. 3 is the alternator circuit with the coils 20, 20' and 20" illustrated in FIG. 5. Also shown is a connection of the primary coils T1', T2' and T3' so that the coils each have one end connected to one of the respective terminals A, B and C and each respective primary coil has its other end connected in common so that all three primary coils have one end connected in common. Each transformer T1, T2 and T3 has its secondary coil T1", T2" and T3", respectively, as a center tapped secondary coil which has its respective opposed ends labeled A, −A, B, −B and C, −C, respectively. The connection of the transformers T1, T2 and T3 shown in FIG. 5 so as to perform the operation of voltage measuring devices is shown with greater detail in the circuit schematic diagram of FIG. 6. In FIG. 6, it is seen that the A phase, the B phase and the C phase are input to the primary coils of T1, T2 and T3 and that the common terminal 25 is shown for the primary coils for these three transformers. The secondary coils T1", T2" and T3" are shown as they are connected to the balance of the circuit in FIG. 6. In FIG. 6, there is shown that a zero crossover leg for the A phase which will serve as the initial example of the circuit in FIG. 6. In the leg for the A phase, the transformer T2 has its secondary coil T2" connected with the −b voltage connected to the positive input of a first buffer amplifier 30 and the center tap connected to a ground potential. The transformer T3 has its secondary T3" with the positive c terminal connected to the positive terminal of a second buffer amplifier 30' and its center tap connected to ground potential. The output of the first comparator 30 is applied to the positive input of the buffer amplifier 32 and the output of the buffer amplifier 30' is connected to the negative input of the comparator 32. The function of the comparator 32 is to determine when the output of the buffer amplifier 30 is equal in magnitude and opposite in polarity from the output of the buffer amplifier 30'. At the instant when that relationship occurs, the comparator 32 outputs a signal which indicates the zero crossover event for the A phase. The particular operation of the circuit of FIG. 6 is shown in FIG. 7, where it is seen that the output of the comparator 32 is a transition from a positive 5 volt level to a negative approximate 13 volt level. That transition direction indicates that the A phase is undergoing a positive to negative transition and the time of occurrence of the transition is the time of occurrence of the zero crossing for the A phase. If the output of the comparator 32 is transitioned from −14 volts to +5 volts, this indicates that the A phase transition is made from a negative to a positive value in the occurrence of the zero crossover event. The output of the comparator 32 is applied to the input as a single shot circuit 34 which generates a small square wave pulse indicating the instant of occurrence of the transition shown at the output of the comparator 32. The output of the single shot 34 can be used as a binary value signal which can be applied to utilization circuits such as the waveform coincidence detector circuit of the Ross and Woodworth patent, described above and as is seen in FIG. 8 herein.

As can be seen in the circuit diagram of FIG. 6, each respective zero crossover phase is identified by means of a particular monitoring leg, the A phase leg having been described above.

The B phase leg consists of a buffer amplifier 30b and 30b' whose outputs are applied to the input of a comparator 32b. The output of the comparator 32b is then applied to a single shot 34b which provides a binary signal output which can be applied to utilization logic.

The C phase monitoring leg includes the buffer amplifier 30c and 30c'. The outputs of the buffer amplifier 30c and 30c' are applied to the inputs of the comparator 32c. The output of the comparator 32c can be applied to a single shot 34c. The output of the single shot 34c will be a binary value which can be applied in logic utilization circuits.

It can be seen that in the B phase monitoring leg, the comparator 30b has its positive input terminal connected to the secondary T3" and to its negative c terminal and that the buffer amplifier 30b and the buffer amplifier 30b' has its positive input terminal connected to the +a terminal of the secondary T1".

In the C phase monitoring leg, it can be seen that the buffer amplifier 30c has its positive input terminal connected to the negative a terminal of the T1" secondary and that the buffer amplifier 30c' has its positive terminal connected to the +b terminal of the T2" secondary.

The operation of the invention provides a noise tolerant zero voltage crossover detector for all three phases of a three phase power system.

Although a specific embodiment of the invention has been disclosed, it will be understood by those having skill in the art that minor changes can be made to the details of this specific embodiment without departing from the spirit and the scope of the invention.

What is claimed is:

1. A zero voltage crossover detector for a three phase power system, having A, B and C voltage phase inputs, comprising:
    a first voltage measurement means connected between said A phase input and said B phase input, having a first measured voltage output, for measuring the voltage between said A phase input and said B phase input;
    a second voltage measurement means connected between said A phase input and said C phase input, having a second measured voltage output, for measuring the voltage between said A phase input and said C phase input;
    a comparator means having a first input connected to said first output of said first voltage measurement means and a second input connected to said second output of said second voltage measurement means, for generating a signal when said first measured voltage is substantially equal in magnitude and opposite in polarity from said second measured voltage, indicating a zero voltage crossover event for said A phase.

2. A method for detecting zero voltage crossover for a three phase power system, having A, B and C voltage phase inputs, comprising the steps of:
    measuring a first voltage between said A voltage phase input and said B voltage phase input and producing a first measured voltage output;
    measuring a second voltage between said A voltage phase input and said C voltage phase input and producing a second measured voltage output;
    comparing said first measured voltage output to said second measured voltage output and generating a signal when said first measured voltage is substantially equal in magnitude and opposite in polarity from said second measured voltage, indicating a zero voltage crossover event for said A voltage phase.

3. A zero voltage crossover detector for a three phase power system, having A, B and C voltage phase inputs, comprising:
    a first transformer having a first primary coil connected between said A voltage phase input and a common node, and further having a first secondary coil with a first terminal at a first end having a positive voltage when said A voltage phase is positive, a second terminal at an opposed second end having a negative voltage when said A voltage phase is positive, and a center tap connected to ground potential;
    a second transformer having a second primary coil connected between said B voltage phase input and said common node, and further having a second secondary coil with a first terminal at a first end having a positive voltage when said B voltage phase is positive, a second terminal at an opposed second end having a negative voltage when said B voltage phase is positive, and a center tap connected to ground potential;
    a third transformer having a third primary coil connected between said C voltage phase input and said common node, and further having a third secondary coil with a first terminal at a first end having a positive voltage when said C voltage phase is positive, a second terminal at an opposed second end having a negative voltage when said C voltage phase is positive, and a center tap connected to ground potential;
    a first voltage comparator means having a first input connected to said second terminal of said second secondary coil and having a second input connected to said first terminal of said third secondary coil, for generating a first output signal when said first input thereof has a voltage substantially equal in magnitude and opposite in polarity from a voltage on said second input thereof, indicating a zero voltage crossover event for said A phase;
    a second voltage comparator means having a first input connected to said second terminal of said third secondary coil and having a second input connected to said first terminal of said first secondary coil, for generating a second output signal when said first input thereof has a voltage substantially equal in magnitude and opposite in polarity from a voltage on said second input thereof, indicating a zero voltage crossover event for said B phase;
    a third voltage comparator means having a first input connected to said second terminal of said first secondary coil and having a second input connected to said first terminal of said second secondary coil, for generating a third output signal when said first input thereof has a voltage substantially equal in magnitude and opposite in polarity from a voltage on said second input thereof, indicting a zero voltage crossover event for said C phase.

4. A zero voltage crossover detector for a three phase power system, having A, B and C voltage phase inputs, comprising:
    a first transformer having a first primary coil connected between said A voltage phase input and a common node, and further having a first secondary coil with a first terminal at a first end having a positive voltage when said A voltage phase is positive, a second terminal at an opposed second end having a negative voltage when said A voltage phase is positive, and a center tap connected to ground potential;
    a second transformer having a second primary coil connected between said B voltage phase input and said common node, and further having a second secondary coil with a first terminal t a first end having a positive voltage when said B voltage phase is positive, a second terminal at an opposed second end having a negative voltage when said B voltage phase is positive, and a center tap connected to ground potential;
    a voltage comparator ;means having a first input connected to said second terminal of said first secondary coil and having a second input connected to said first terminal of said second secondary coil, for generating an output signal when said first input thereof has a voltage substantially equal in magnitude and opposite in polarity from a voltage on said second input thereof, indicating a zero voltage crossover event for said C phase.

* * * * *